(12) United States Patent
Kenney (10) Patent No.: US 8,372,495 B2
(45) Date of Patent: Feb. 12, 2013

(54) ELECTRONIC DEVICE ENCLOSURE USING SANDWICH CONSTRUCTION

(75) Inventor: Kevin M. Kenney, San Jose, CA (US)

(73) Assignee: Apple Inc., Cupertino, CA (US)

( * ) Notice: Subject to any disclaimer, the term of this patent is extended or adjusted under 35 U.S.C. 154(b) by 248 days.

(21) Appl. No.: 12/788,062

(22) Filed: May 26, 2010

(65) Prior Publication Data

US 2011/0290685 A1 Dec. 1, 2011

(51) Int. Cl.
*B29D 22/00* (2006.01)
(52) U.S. Cl. ................... 428/34.1; 428/35.7
(58) Field of Classification Search ........... 428/35.7, 428/34.1, 116
See application file for complete search history.

(56) References Cited

U.S. PATENT DOCUMENTS

| | | | |
|---|---|---|---|
| 3,814,016 A | 6/1974 | Leach et al. | |
| 4,343,846 A * | 8/1982 | Kohn | 428/138 |
| 5,116,138 A | 5/1992 | Macsenti et al. | |
| 5,237,788 A | 8/1993 | Sandow | |
| 5,249,534 A | 10/1993 | Sacks | |
| 5,395,682 A | 3/1995 | Holland et al. | |
| 5,503,506 A | 4/1996 | Yuan | |
| 5,865,569 A | 2/1999 | Holstein et al. | |
| 5,967,357 A | 10/1999 | Kellogg et al. | |
| 6,117,517 A * | 9/2000 | Diaz et al. | 428/102 |
| 6,435,363 B2 | 8/2002 | Fingerhut et al. | |
| 6,689,246 B2 | 2/2004 | Hirahara et al. | |
| 7,063,763 B2 | 6/2006 | Chapman, Jr. | |
| 7,191,555 B2 | 3/2007 | Hughes | |
| 7,338,235 B2 | 3/2008 | Weghaus et al. | |
| 7,393,577 B2 * | 7/2008 | Day et al. | 428/121 |
| 7,527,321 B1 | 5/2009 | Benderoth et al. | |
| 7,545,628 B2 | 6/2009 | Takuma | |
| 7,571,828 B2 | 8/2009 | Palley et al. | |
| 7,628,879 B2 | 12/2009 | Ackerman | |
| 7,710,728 B2 | 5/2010 | Arisaka et al. | |
| 7,762,028 B2 | 7/2010 | Valentz et al. | |
| 7,790,637 B2 | 9/2010 | DiFonzo et al. | |
| 7,934,676 B2 | 5/2011 | Dufresne et al. | |
| 7,963,483 B2 | 6/2011 | Roming et al. | |
| 7,971,400 B2 | 7/2011 | Boldt et al. | |
| 2007/0134466 A1 * | 6/2007 | Rajaram et al. | 428/116 |
| 2008/0094372 A1 | 4/2008 | Philipp | |
| 2009/0040703 A1 | 2/2009 | Gotham et al. | |
| 2009/0095523 A1 | 4/2009 | Stevenson et al. | |
| 2010/0078254 A1 | 4/2010 | Rolfe et al. | |

(Continued)

FOREIGN PATENT DOCUMENTS

| | | |
|---|---|---|
| EP | 1139638 | 10/2001 |
| EP | 2051572 | 4/2009 |

(Continued)

*Primary Examiner* — N. Edwards
(74) *Attorney, Agent, or Firm* — Dorsey & Whitney LLP (57) ABSTRACT

A housing for an electronic device or other object formed in a layered configuration. The layer or sandwich construction imparts strength and rigidity while decreasing the overall weight to the housing. The case/housing may have a first layer and a second layer formed from a first material. The case may also include a core formed from a second material. Where the first layer may be bonded to a top surface of the core and the second layer may be bonded to a bottom surface of the core.

7 Claims, 7 Drawing Sheets

U.S. PATENT DOCUMENTS

| | | | |
|---|---|---|---|
| 2010/0266833 A1* | 10/2010 | Day et al. | 428/304.4 |
| 2010/0289390 A1 | 11/2010 | Kenney | |
| 2011/0180557 A1 | 7/2011 | Kenney | |
| 2011/0183580 A1 | 7/2011 | Kenney | |
| 2011/0290685 A1* | 12/2011 | Kenney | 206/320 |
| 2012/0021196 A1 | 1/2012 | Kenney | |
| 2012/0147592 A1* | 6/2012 | Takase | 362/97.1 |

FOREIGN PATENT DOCUMENTS

| | | |
|---|---|---|
| JP | 2006123475 | 5/2006 |
| JP | 2007076202 | 3/2007 |
| WO | WO98/15404 | 4/1998 |
| WO | WO2008/133748 | 11/2008 |
| WO | WO2009/017571 | 5/2009 |

* cited by examiner

ELECTRONIC DEVICE ENCLOSURE USING SANDWICH CONSTRUCTION

BACKGROUND

I. Technical Field

Embodiments disclosed herein relate generally to housings, and more specifically to housings for electronic devices formed from multiple materials.

II. Background Discussion

Many electronic devices, including portable devices, have housings made of plastic. Plastic enclosures tend to be relatively inexpensive and simple to manufacture but may be brittle and crack under relatively low stresses or impacts. Other electronic devices have metal housings. Metal casings are durable but may be heavier and/or more expensive to manufacture than an equivalently-sized plastic casing.

Some electronic devices use a reinforced plastic housing. For example, certain devices may have a housing formed from carbon fiber reinforced plastic (CFRP). A standard CFRP may be made of multiple layers, each of which typically has carbon fibers aligned in a plastic matrix such that the fibers all extend in substantially the same direction within that layer. The carbon fibers impart structural strength and resistance to bending and breaking against force applied transversely to the length of the fibers. CFRP materials generally have a high strength to weight ratio and weight to stiffness ratio. However, CFRP materials generally do not resist bending or stresses applied in a direction transverse to the length of the carbon fibers. Further, CFRP may be thicker than a corresponding plastic or metal electronics enclosure having similar weight and/or stiffness.

It is desirable in many instances for portable electronics to be light weight and be as thin as possible. Therefore, the materials currently used for portable electronics (including CFRP, metal and plastic) may not be desirable for every application, as they may be too heavy, too thick or they may not provide enough structural support.

SUMMARY

Embodiments of the disclosure may include an enclosure having a first body forming at least a portion of an outer surface of the enclosure and made from a first material. The enclosure also has a second body forming at least a portion of the inner surface of the enclosure and made from the first material. The enclosure further includes a core formed from a second material. The first body is disposed on a first surface of the core and the second body is disposed on the second surface of the core, such that the first and second bodies substantially encase the core.

Other embodiments of the disclosure include a housing for an electronic device including a top skin and a bottom skin. The housing also includes a body, having a first modulus of elasticity, and the body is sandwiched between the top skin and the bottom skin. The top skin and the bottom skin have a modulus of elasticity that is greater than the first modulus of elasticity of the body. The top skin forms an outer shell of the housing and the bottom skin forms an inner shell of the housing.

Still other embodiments may include a method of manufacturing a protective case, including placing a first skin in a mold, placing a core adjacent to the first skin. Placing a second skin in the mold, the second skin is adjacent the first skin. Curing the first and second skin about the core to form a shell and bonding the shell to a magnesium frame to form a housing.

BRIEF DESCRIPTION OF THE DRAWINGS

The use of the same reference numerals in different drawings indicates similar or identical items.

DETAILED DESCRIPTION

Embodiments of the disclosure are directed towards housings for electronic components. In some embodiments, carbon fiber reinforced plastic (CFRP) materials are assembled in a sandwich configuration around a core material, such that the CFRP material forms a "skin" enclosing, partially enclosing, extending across surfaces of, or extending from the core material. The sandwich structure or configuration may then be used to enclose and otherwise provide housing for electronic components, such as those used for portable electronics. The core of the sandwich material in some embodiments is foam, honeycomb, end grain balsa, and/or other relatively lightweight materials. The CFRP materials in these embodiments may form an outer and inner layer with the core material positioned therebetween, such that the CFRP material may generally encase or overlay at least portions of the core. In some embodiments, the core may be made from a material having a lower density than that of the outer and inner layers. In certain embodiments, the sandwich structure may be lighter in weight and stronger than a similar structure formed of non-sandwiched CFRP materials, aluminum, steel, plastic, and the like. The sandwich configuration may provide lighter weight and have a higher flexural rigidity than housing made of solid materials, because the distance between the two layers of CFRP materials may be increased while a minimum amount of weight is added through the use of the interior material. In other words, the interior or core material is generally lighter than the sandwiching material and thus provides a weight savings over the use of a structure made entirely from the sandwiching material and having similar dimensions.

Additionally, in these embodiments, the sandwich structure may reduce a clearance necessary for encasing electronic components, for example in laptops, smart phones, and the like. Generally, electronics enclosures are designed to include a space between the enclosed electronics and an inner surface of the housing to account for flexing, bending and other deformations of the housing resulting from impacts, pressures and the like. The clearance is sufficient to prevent the housing and interior electronics from contacting one another even when the housing is deformed. The exact dimensions and nature of such clearance depends on many factors including the overall size of the electronic device, maximum stresses for which the housing is designed, the types of electronics enclosed and so on.

This clearance between the housing and the electronic components may be reduced because the sandwich configuration may provide better structural integrity, e.g., have a higher flexural rigidity than other housing materials. The higher the flexural rigidity, the less the material may bend in response to a force. Thus, because the sandwich configuration is generally stiffer and less likely to bend inwards in response to an external force than a single-material housing, the electronic components may be placed closer to the housing, and the clearance reduced accordingly.

The sandwich configuration allows for the strength and flexural resistance of the housing or case to be increased while maintaining the original thickness of the housing. In this manner, a housing may be made of a sandwich construction in the same dimensions as a single-material housing without increasing the thickness of housing or associate electronic device. In some embodiments, this may be accomplished because of the increased flexural rigidity may allow for a decrease in clearance between the housing and the electronic components encased inside the housing. Similarly, the sandwich configuration may also allow for a significant weight reduction without a decrease in performance or change in exterior shape.

One skilled in the art will understand that the following description has broad application. For example, while embodiments disclosed herein may take the form of casing or housing materials for portable electronic devices, it should be appreciated that the concepts disclosed herein equally apply to housing for non-portable electronics. Furthermore, while embodiments may be discussed herein with respect to CFRP materials, other materials having a relatively similar modulus of elasticity may be used. Also, for the sake of discussion, the embodiments disclosed herein are discussed with respect to casing or housing materials for electronic devices; however, these concepts apply to areas outside of the electronic devices context, e.g., to general construction techniques, storage and/or luggage design, and the like. Accordingly, the discussion of any embodiment is meant only to be exemplary and is not intended to suggest that the scope of the disclosure, including the claims, is limited to these embodiments.

Figure 1A:
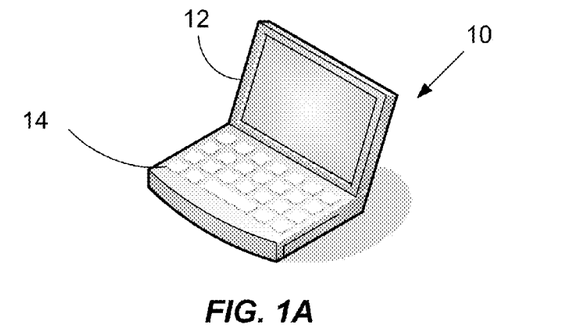
FIG. 1A illustrates a side isometric view of a laptop in an open configuration.
Figure 1B:
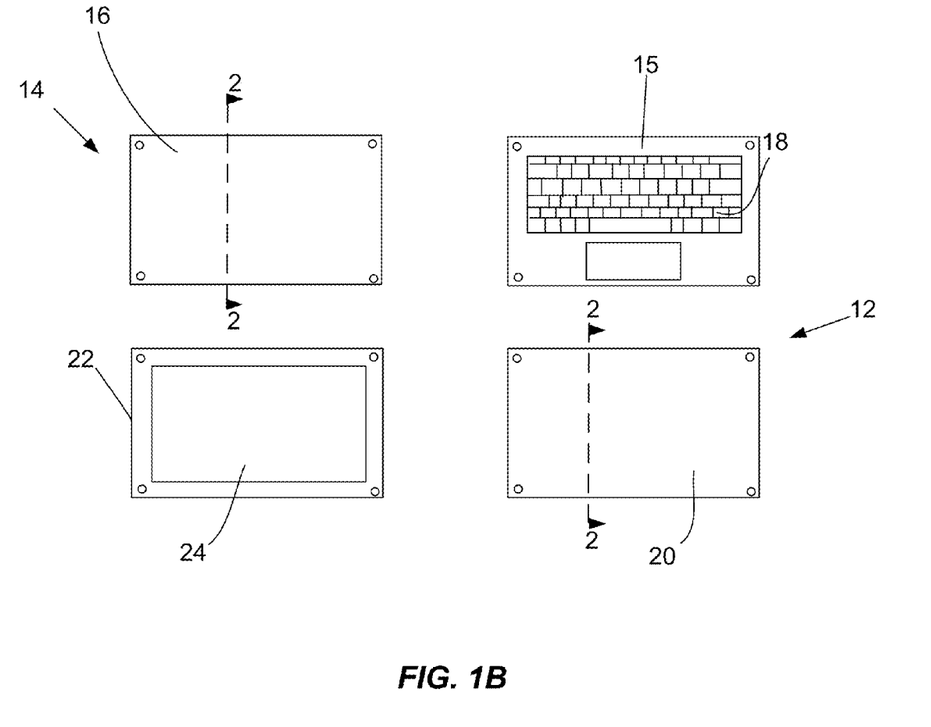
FIG. 1B illustrates a plan view of external components of the laptop illustrated in FIG. 1A.

FIG. 1A illustrates a perspective view of a laptop, and FIG. 1B illustrates the external housing components the laptop 10 in an exploded view. The laptop 10 may include a screen housing 12 and a body housing 14. The screen housing 12 may include a screen back panel 20 that encases a back portion of a screen 24, as well as a screen front panel 22, which encases or secures a front portion of the screen 24. Essentially, the screen or other display may be enclosed by the combination of screen front and back panels.

The housing generally provides protection and security for the internal components and may prevent the connections and components from being damaged due to a user dropping, throwing, scratching, denting, or the like, the laptop 10. The screen housing 12 generally is used to provide support, strength and protection for the laptop 10 screen 24, as well as any other electronic components that may be located in a top piece of the laptop 10.

In other embodiments, the screen housing 12 may consist of a single integrated piece of construction, as opposed to the two separate pieces (screen back housing 24, and screen front housing 22) illustrated in FIG. 1B. Similarly, the body housing 14 may include a keyboard panel 15, that surrounds or overlies a top portion of a keyboard 18 as well as a body back panel 16 that surrounds the other internal components of the laptop 10. The body housing 14, in addition to securing and supporting the keyboard 18, may also encase other functional electrical components of the laptop 10, such as a processor, hard drive or other memory, power circuits, and the like. In addition to the aforementioned panels, one or more sidewalls may cooperate to enclose the keyboard, screen or other electronic components. The sidewall(s) may be formed contiguously with one or both of the panels or formed separately.

It should be noted that the housing components (e.g., the screen housing 12 and body housing 14) may be configured in multiple configurations depending on the structure of the laptop 10. For example, in some instances the laptop 10 may be a tablet computer, and as such omit the keyboard 18. In these embodiments, the body housing 14 may be omitted and the screen housing 12 may encase the screen 24 as well the other electronic components (e.g., processor, hard drive, and the like). Further, although a laptop 10 has been illustrated, the disclosure herein applies to housing used for a variety of portable and non-portable electronic devices, such as smart phones, digital cameras, personal digital assistants, mobile telephones, audio devices, desktop computers, computer monitors, and the like. Additionally, the disclosure herein may also apply to other non-electronic applications, such as storage boxes, luggage, non-digital cameras, and other applications that may require lightweight, high flexural rigidity casing.

Figure 2:
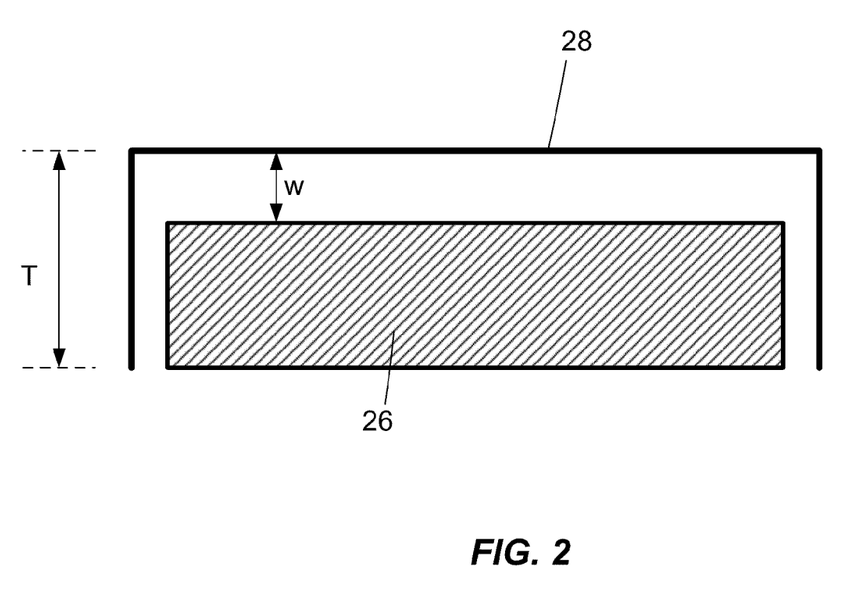
FIG. 2 is a cross-section view of a solid housing for electronic components viewed along line 2-2 in FIG. 1.

FIG. 2 illustrates an example of a solid housing 28 that may be used with the laptop 10. The solid housing 28 may be implemented as either the screen housing 12 and/or the body housing 14 and may be constructed out of aluminum, plastic, steel, magnesium, or titanium. In these constructions the solid housing 28 may have a set clearance W from the electronic components 26, because the solid housing 28 may deform or flex inwards when force is exerted on the solid housing 28. If there was no clearance or distance between the electronic components 26 and the solid housing 28, then the solid housing 28 may damage the electronic components 26 when an external force is exerted on the housing 28. For example, if the solid housing 28 is dropped it may deform (due to the force produced by being dropped), when the solid housing 28 deforms or flexes inwards, it may hit portions of the electronic components 26 within the device. Therefore, the clearance W may be set such that solid housing 28 may deform up to a distance W before hitting the electronic components 26. These embodiments help to protect the laptop 10 from damage. For example, when a laptop 10 is dropped, the solid housing 28 absorbs the force and may deform in response. Typically laptops 10 are engineered to deform up to a set clearance level W without damaging the electronic components 26. In some instances, the clearance level W may be dependent upon the anticipated structural loads that the device (e.g., the laptop 10) may encounter, as well as the sensitivity of the electronic components 26. For example, the screen housing 12 of the laptop 10 may include a larger clearance than the body housing 14, due to the fact that the screen 24 may be more easily damaged.

The amount that the solid housing 28 material may deform under different force conditions may depend on the bending resistance or stiffness of the material, also known as the flexural rigidity. The flexural rigidity determines how flexible a material may be and how much the material may deform or bend when force is exerted onto the material. The flexural rigidity may be described as a product of the modulus of elasticity for particular material and the area of inertia. This relationship for a rectangular cross section of a beam may be illustrated by Eq. 1 listed below.

$$D = \frac{E * b * t^3}{12} \qquad \text{Eq. 1}$$

In Eq. 1, D represents the flexural rigidity of the beam, E is the modulus of elasticity for the material, b represents the width of the beam and t is the thickness of the beam.

As discussed with regard to FIG. 2, the clearance level W depends on the flexural rigidity of the solid housing 28. For example if the solid housing 28 has a low flexural rigidity the clearance W is higher as the solid housing 28 will deform more severely than a solid housing 28 material with larger flexural rigidity. Therefore, if the solid housing 28 is made out of aluminum, the clearance W may be set to be relatively large as aluminum is flexible and deforms to, as opposed to resisting, external forces. In electronic devices it may be desirable to form the housing out of materials that have a large flexural rigidity in order to better prevent large deformations, and thus better protect the electronic components 26 from damage due to bumps, drops, scratches, and the like.

Figure 3:
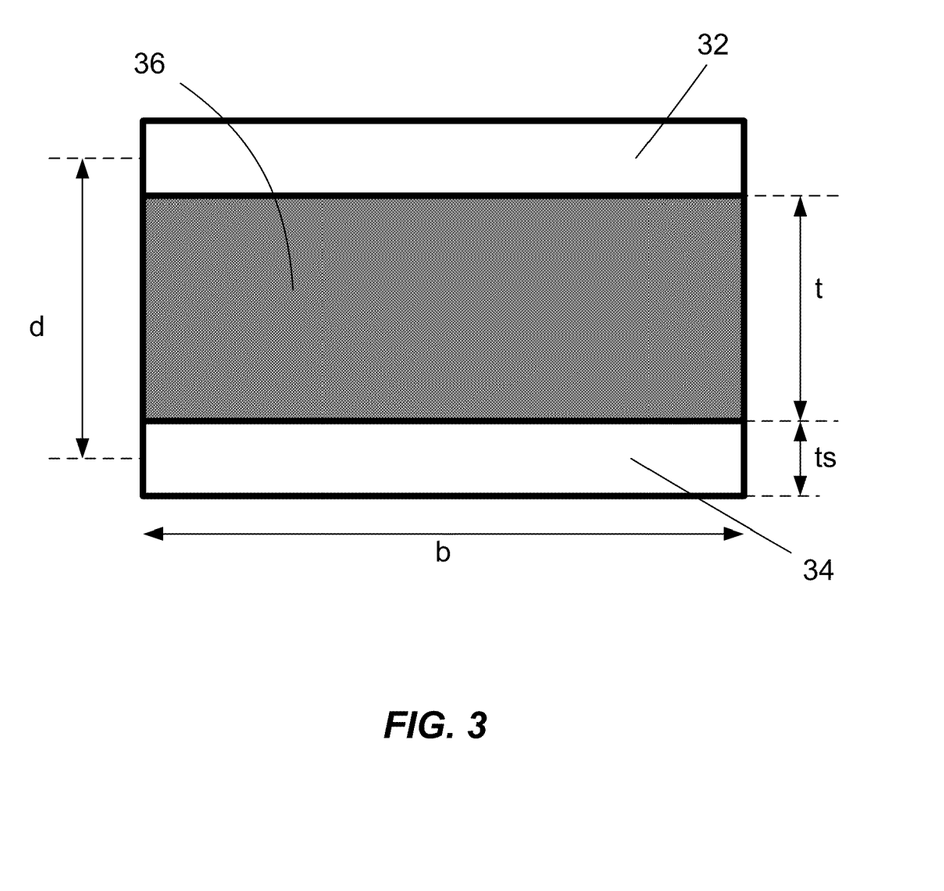
FIG. 3 is plan view of a sandwich configuration.
Figure 4:
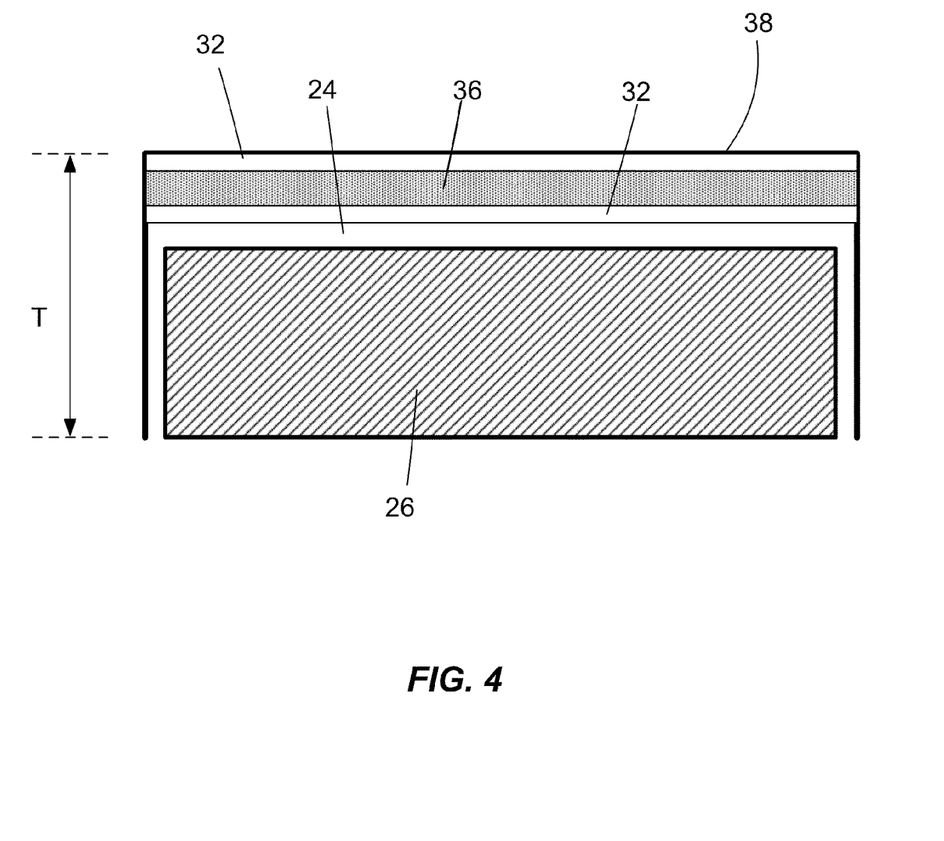
FIG. 4 is a cross-section view along line 2-2 in FIG. 1 of the sandwich configuration illustrated in FIG. 3, installed as a housing for electronic components.

FIGS. 3 and 4 illustrate an embodiment of the disclosure having a sandwich configuration 30 that may be used to create a housing 38. FIG. 3 is a plan view of the sandwich configuration 30, and FIG. 4 is a cross-section view of the sandwich configuration 30 used as the housing 38 to protect the electronic components 26. The housing 38 may be used to protect the internal components of the laptop 10, as well as other devices. The sandwich configuration 30 may include a top layer 32, a bottom layer 34 and a core 36. The top layer 32 and the bottom layer 34 may surround or substantially encase the core 36, for instance, the layers 32, 34 may act as "skins" that form the outside coating of the core 36. In these embodiments, the layers 32, 34 may be connected to the core 36, as well as separated from each other by the core 36. In some embodiments, the top layer 32 and bottom layer 34 may be CFRP materials, and the layers 32, 34 may be bonded to the core 36 or otherwise attached. The layers 32, 34 may be bonded to the core 36 via epoxy, heat sealing, fasteners, or any other methods or materials that can secure the layers 32, 34 to the core 36.

The core 36 forms the middle portion of the sandwich configuration 30 and in some embodiments the core 36 is a light weight and/or light density material. In some embodiments the core 36 may be a foam, such as polymethacrylimide closed cell foam, urethane closed cell foam, polyurethane closed cell foam or the like. In these embodiments, closed cell foams may be used, as open cell foams may absorb resin and gain weight during processing. However, in other embodiments open cell foams may be used. In still other embodiments, the core 36 may be a honeycomb structure material, such as aluminum honeycomb, an aramid paper honeycomb, or the like. In further embodiments, the core 36 may be end grain balsa or other similarly light weight materials. Thus, the core 36 may be a lighter-weight material than the layers 32, 34, as such that increasing the thickness of the core 36 may not significantly increase the overall weight of the sandwich configuration 30. Similarly, in some embodiments, the core 36 may be a material having a lower density than that of the layers 32, 34.

The sandwich configuration 30 may increase the overall flexural rigidity of the housing 38, while the overall thickness (e.g., the height) of the sandwich configuration 30 may remain substantially the same. Eq. 1 illustrates relationship for determining the flexural rigidity of the solid housing 28. The flexural rigidity of the sandwich configuration 30 may be represented by Eq. 2 listed below, where the housing 38 includes two layers and a core. In Eq. 2, $E_L$ is the modulus of elasticity for the top layer 32, and the bottom layer 34; b represents the width of the beam; $t_L$ represents thickness of each of the layers 32, 34; d represents the distance between the centroids of the layers 32, 34; and $t_c$ represents the thickness of the core 36.

$$D = \frac{E_L * b * t_L^3}{6} + \frac{E_L * b * t_L * d^2}{2} + \frac{E_C * b * t_C^3}{12} \qquad \text{Eq. 2}$$

In some embodiments, the core 36 may be a material with a significantly lower modulus of elasticity than the layers 32, 34. In these embodiments, Eq. 2 may be reduced to Eq. 3 listed below, as the modulus of elasticity for the core 36 may be ignored because it does not significantly affect the overall flexural rigidity.

$$D = \frac{E_L * b * t_L^3}{6} + \frac{E_L * b * t_L * d^2}{2} \qquad \text{Eq. 3}$$

As shown in Eq. 3, depending on the modulus of elasticity for layers 32, 34 material, the flexural rigidity of the sandwich configuration 30 (D) may be significantly influenced by the distance (d) between the centroids of the layers 32, 34. As such, in some embodiments, by increasing the thickness of the core 36 the distance (d) between the centroids of the layers 32, 34 may be increased. In these embodiments, the core 36 material may be significantly lighter weight than the material for the layers 32, 34. Therefore, the distance between the centroids for the two layers 32, 34 may be increased (increasing the overall flexural rigidity), but the sandwich configuration 30 may experience only a small corresponding gain in weight. In other words, for embodiments where the core 36 may be constructed out of light weight material (e.g., foam, honeycomb, balsa, and the like), the distance between the centroids of the top layer 32 and the bottom layer 34 may be increased, without significantly increasing the total overall weight of the sandwich configuration 30. Therefore, in some embodiments, the sandwich configuration 30 may be used to create a lighter housing 38 than the solid housing 28, and the housing 38 may have a stronger flexural rigidity than the solid housing 28 (such as that shown in FIG. 2). For example, in order to increase the overall flexural rigidity of the solid housing 28, the thickness (or distance) for the material must be increased, which may significantly increase the overall weight of the solid housing 28 because the solid material may be substantial and thus heavier. Whereas with the sandwich configuration 30 the distance may be increased without significantly increasing the weight of the housing 38 or the device.

It should also be appreciated that embodiments disclosed herein may use less material in the layers 32, 34 where the layers overlie or contact the core 36 than where the core is not present. That is, the layers 32, 34 may be pared away or thinned adjacent the core but not elsewhere. In some embodiments, the outer edges, and/or areas near the outer edges, may be made of layers having more material (or more constituent sheets/layers of material) than in the middle of a housing, where the aforementioned sandwich configuration may be used. Thus, returning to FIG. 1 for an example, the inner sections of panels 20, 22 may be sandwich configurations while the portions of the housing at or near the edges lack the sandwich configuration and are made from a single material (or a single material wrapped around a frame).

As discussed with respect to Eq. 3, the sandwich configuration 30 may be used to create a lighter housing 38 including a higher flexural rigidity than a singular material construction, e.g., the solid housing 28. Referring now to FIG. 4, the sandwich configuration 30 may be used for housing 38 for electronic components 26 (such as the internal components to the laptop 10 in FIG. 1). The top layer 32 and bottom layer 34 surround the core 36 and the entire configuration 30 surrounds the electronic components 26. In these embodiments, the clearance 24 between the housing 38 and the electronic components 26 may be lower than the clearance W illustrated in FIG. 2, as the sandwich configuration 30 may have a stronger flexural rigidity, and thus require a smaller clearance level to adequately protect the electronic components 26. For example, the clearance level may be decreased for the housing 38 (as compared with the solid housing 28) because the sandwich configuration 30 may deform less (that is, be stiffer) than the solid material used for the solid housing 28. Because the sandwich configuration 30 may be less likely to deform drastically, the distance between the housing 38 and the electronic components 26 may be reduced, while allowing the housing 38 to provide the same or better level of protection.

In other embodiments, the clearance between the electronic components 26 and the housing 38 may remain the same as shown in FIG. 2, for instance in applications where a significant amount of protection for the electronic components 26 is desired. In some embodiments, any decrease in the clearance level may require a corresponding increase in the flexural rigidity of the housing 38. For example, in these embodiments, if the clearance is reduced by 50% the flexural resistance may be increased by 50%. In these embodiments, the modulus of rigidity is inversely proportional to the deformation of the panel under a given force. Therefore, if the clearance is reduced by 50% and the modulus of rigidity is increased by 50% the design clearance for the given force may remain the same.

In these embodiments, the overall performance of the housing 38 may remain consistent (or better than) the solid housing 28, as illustrated in FIG. 2. For example if the solid housing 28 is made out of a single material, such as aluminum, with a set clearance level, the housing 38 using the sandwich configuration 30, may have a stronger flexural rigidity and therefore require lower clearance level, be lighter weight and have the same or better structural loading performance.

In some embodiments, the overall thickness for the case including the solid housing 28 or the housing 38 may remain consistent. For example, although the overall thickness of the solid material used in the solid housing 28 may be less than the overall thickness of the sandwich configuration 30, the total overall thickness for both the solid housing 28 and the housing 38 may remain the same. This may be the case because the housing 38 incorporating the sandwich configuration 30 may have a higher flexural rigidity and thus may only require a clearance level that is a fraction of the clearance level required for the solid housing 28.

Figure 5A:
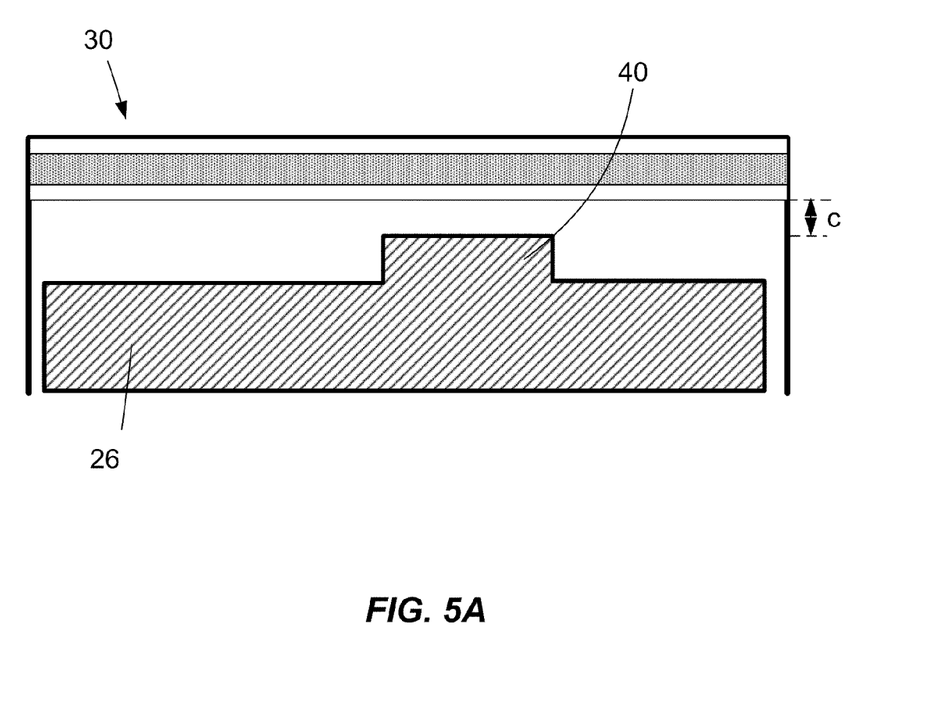
FIG. 5A is a cross-section view of an embodiment of the housing illustrated in FIG. 4 viewed along line 2-2 in FIG. 1, where the electronic components include an electronic protrusion.
Figure 5B:
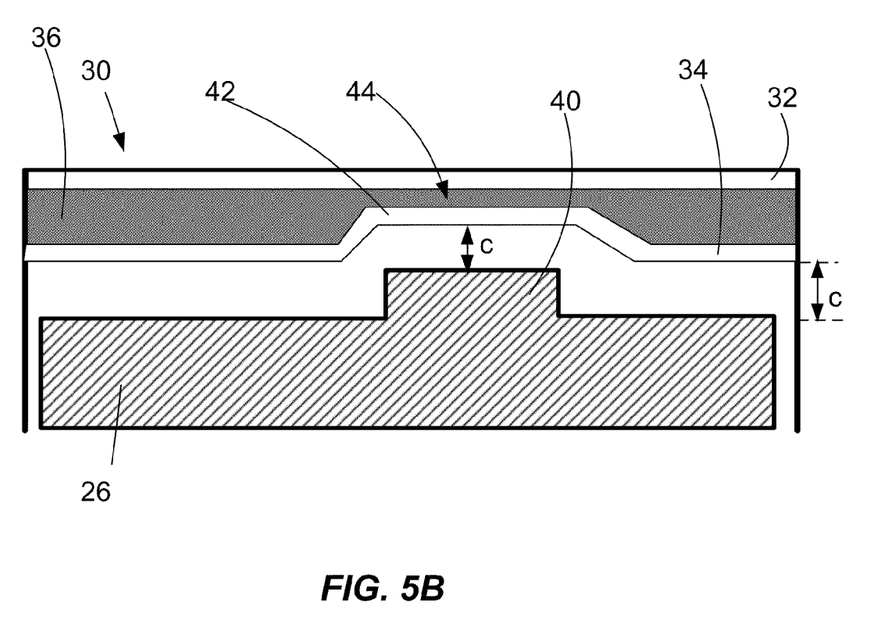
FIG. 5B is a cross-section view of another embodiment of the housing illustrated in FIG. 5A.

FIGS. 5A and 5b illustrate some embodiments of the housing 38 used to provide a case for electronic components 26, where the electronic components 26 may include an electronic device 40 that generally protrudes within the housing. In some embodiments, the housing 38 may be tailored to accommodate protrusions for electronic elements. Referring to FIGS. 5A and 5B, an electronic device 40 is located on the electronic components 26 plate. The electronic device 40 may be a component which may be larger/taller than the other components, for example a hard drive, processors, and the like. In FIG. 5A, the sandwich configuration 30 may have a substantially consistent width/thickness throughout the length of the electronic components 26. In these embodiments, the minimum clearance level required to protect the electronic components 26, including the electronic device 40, may be measured from the top of the electronic device 40. In other words, the clearance for the other areas of the electronic components 26 may be more than is necessary due to the added height of the electronic device 40. These embodiments may result in an additional thickness being added to the overall device, such as the laptop 10. Also, in these embodiments, the core 36 may remain substantially the same thickness throughout the entire length of the housing 38.

FIG. 5B illustrates other embodiments of the housing 38 incorporating the sandwich configuration 30. As shown in FIG. 5B, the height of the clearance between the sandwich configuration 30 and the electronic device 40 may be adjusted around the electronic device 40. This adjustment area 42 may be raised to provide the minimum amount of clearance between the bottom layer 34 and the top of the electronic device 40. In these embodiments, the core 36 may be reduced by a distance 44, such that the height of the top layer 32 compared with the bottom level of the electronic components 26, may remain consistent throughout the length of the electronic components 26.

In some embodiments the layers 32, 34 may be formed via a single molding process, which may allow for localized adjustments in height and width for the housing 38. These embodiments may provide a more streamlined and thinner overall device, because the although there may be an electronic device 40, the clearance level may be specifically set over the protrusion 40, rather than increasing the total clearance level. For example, in some embodiments, the electronic device 40 may be less sensitive than the other electronic components 26 and therefore thickness of the sandwich configuration 30 may be thinner over the electronic device 40.

In certain embodiments, a frame may be constructed from a first material and CFRP wrapped therearound to form the outer skin of the electronics housing 38. The frame may be made, for example, from magnesium to afford both structural strength and a light weight. In alternative embodiments different materials may be employed to form the frame, such as one or more metals, ceramics, composites, plastics and the like.

In certain embodiments, the CFRP skin may be formed from multiple layers of CFRP material, each of which may have the carbon fibers aligned in a different direction than adjacent layers. In one embodiment, eight layers of CFRP material are placed together to make the CFRP skin about the magnesium frame. Where a foam or other inner material is used to create the aforementioned sandwich configuration, the CFRP is thinned such that a fewer number of layers is present. That is, adding the layers used to make the inner and outer surfaces of the "sandwich" yields fewer layers than are used when the sandwich configuration is not present. Continuing the prior example, four layers of CFRP material may be removed so that two layers are present on either side of the inner foam when constructing the electronic housing. Thus, certain sections of the housing may have eight layers of CFRP material, while other sections use a foam and four layers of CFRP material, namely two above and two below the foam.

Figure 6:
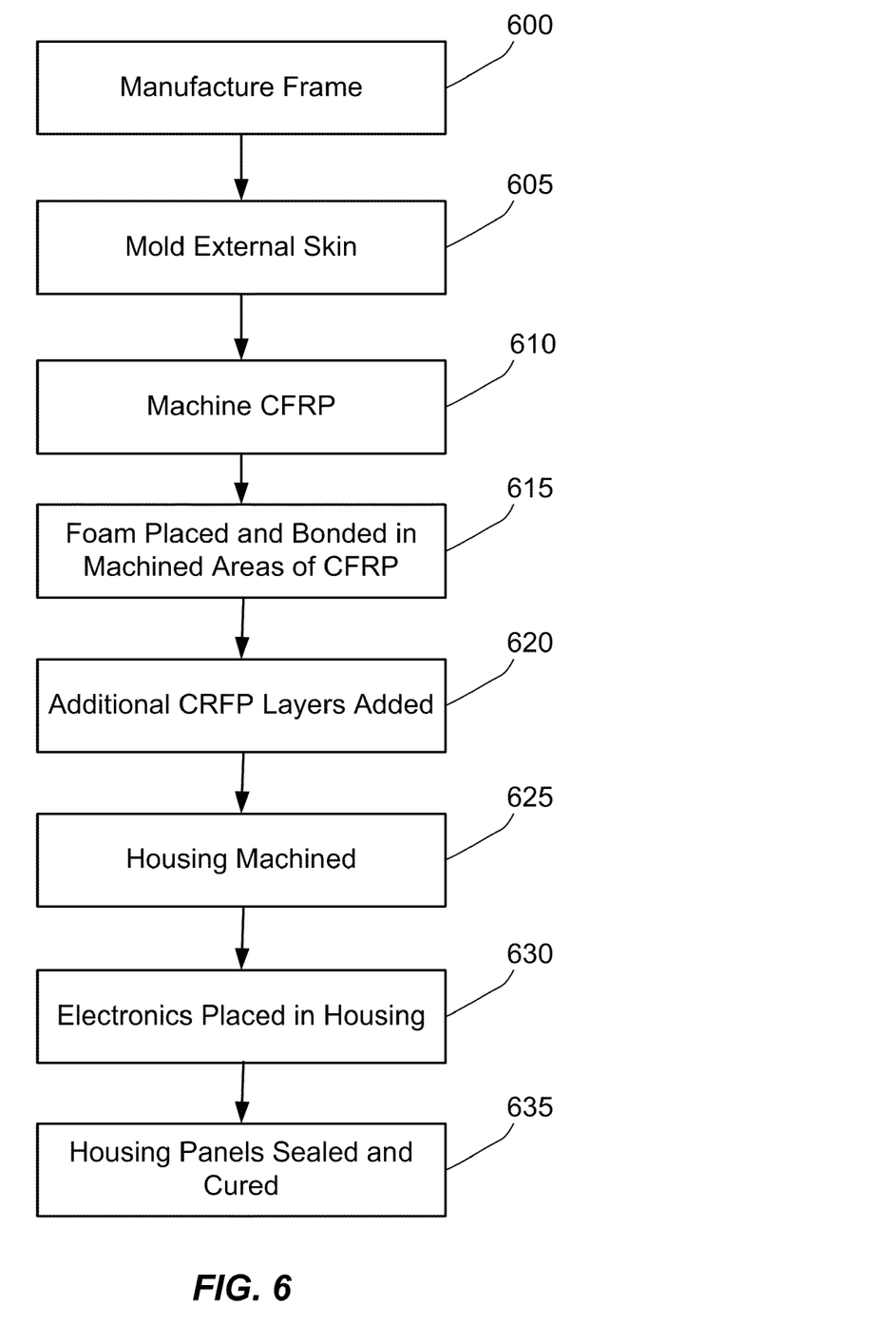
FIG. 6 is a flow diagram illustrating a method of manufacturing a housing including the sandwich configuration.

FIG. 6 is a flowchart generally depicting a process for manufacturing a sample electronic housing. First, a frame may be manufactured in operation 600. In some embodiments, the frame may be made from magnesium as previously mentioned. The frame may be generally rectangular or any shape desired. Typically, the frame does not include any solid panels (such as the front panel, back panel and the like) as these panels will be formed from a sandwich configuration of CFRP and foam or other suitable materials, but in some embodiments the frame may define one or more panels.

In operation 605, the external skin of the housing may be molded from CFRP. This is generally accomplished by forming the various panels and/or sidewalls from a multi-layered CFRP material. The magnesium frame may be placed in a mold with CFRP material and heated to a certain temperature. When the temperature is reached, the CFRP material may become liquid and flow about the frame and into a desired shape. This may be controlled, for example, through the use of an appropriately-configured mold. In some embodiments, the magnesium frame may be bonded to the CFRP material, for instance by adhesive or the like. In these embodiments, the CFRP may be bonded to the magnesium frame after the CFRP has been molded into the desired shape.

In operation 610, the CFRP may be machined in certain areas to remove one or more layers. This is an optional operation in certain embodiments. Generally, the CFRP is machined where foam will be deposited to form the sandwich configuration.

In operation 615, a foam or other suitable material is placed in the machined areas of the CFRP and bonded thereto. As previously mentioned, the bonding between the CFRP and foam may take many forms.

Next, in operation 620, additional layers of CFRP may be placed over the foam. These additional layers may bond not only to the foam, but also to adjacent portions of the housing formed from CFRP or another suitable material. In this manner, the foam may be sandwiched between two layers of CFRP and those layers may be integrally joined to the rest of the housing. Typically, although not necessarily, the inner CFRP layer matched the contour of the foam. In other embodiments, the CFRP material and the core material (i.e. foam) may be placed into a single mold and cured together.

After the housing has cured from the foregoing operations, in operation 625 it may be machined to provide cutouts, raised features and the like in the inner or outer surfaces of the housing. It may be desirable, for example, to form guide and/or attachment features within the inner housing to allow electronic components to be more precisely aligned and attached to the housing. In some embodiments, a first or outer layer of CFRP may be cured to a first side of the core material and then the first skin (e.g. CFRP outer layer) and the core may be machined to accommodate the desired shape, and then the second skin may be added. For instance, the CFRP outer layer and the core may be machined to accommodate the electronic device 40, as illustrated in FIG. 5B. Once the outer layer CFRP and the core have been machined to the proper shape, the inner skin may be molded over the core.

In operation 630, the electronics may be placed within the housing. Next, in operation 635, the panels of the housing may be sealed together and cured to form the final product.

In certain embodiments, operations described in FIG. 6 may be employed to manufacture various housing panels which may then be later assembled together to form the housing Accordingly, it should be understood that the foregoing method of manufacture is an example and other ways will occur to those of ordinary skill in the art. Further, in certain embodiments fewer layers of CFRP (or other suitable material) may be bonded to the frame in operation 605. In these embodiments, no CFRP needs to be machined way prior to the placement of the inner sandwich material. Instead, after the inner sandwich material is placed, one or more CFRP layers (or layers of other suitable material) may be placed over the entire assembly as opposed to just the foam portions. The housing may then be cured to join the CFRP layers together. In certain embodiments the overall thickness of the panels formed by this method may be no more than 1.4 millimeters.

It should be appreciated that embodiments described herein may attempt to use relatively little foam or other inner sandwich material. That is, embodiments may seek to place the CFRP panels only slightly apart from one another in order to gain strength but not sacrifice overall size or become too heavy. By removing just a portion of the CFRP material and replacing it with foam in a thin core, significant weight savings may be achieved.

Although embodiments have been described herein with reference to particular methods of manufacture, shapes, sized and materials of manufacture, it will be understood that there are many variations possible to those skilled in the art. For example other polymers and/or composites may be used in place of CFRP. Accordingly, the proper scope of protection is defined by the appended claims.

What is claimed is:

1. An enclosure for housing at least one electronic component, comprising:
   a sandwich configuration comprising:
      a first layer forming at least a portion of an outer surface of the enclosure and made from a first material having fibers aligned in a matrix;
      a second layer forming at least a portion of the inner surface of the enclosure and made from the first material;
      a core formed from a second material, the second material being one of a closed cell foam, honeycomb, or balsa wood; wherein
      the first layer is disposed on a first surface of the core and the second layer is disposed on a second surface of the core, such that the first and second layers substantially enclose the core; wherein
   the sandwich configuration is spaced apart from the at least one electronic component by a clearance distance.

2. The enclosure of claim 1, wherein the core is less dense than the first layer and the second layer.

3. The enclosure of claim 1, wherein the first layer and the second layer are formed from multiple sheets of carbon fiber reinforced plastic.

4. The enclosure of claim 1, wherein the core material has a lower modulus of elasticity than the first layer and the second layer.

5. The enclosure of claim 1, wherein the core separates at least a portion of the first layer from at least a portion of the second layer.

6. The enclosure of claim 5, wherein the portion of the first layer is bonded to the first surface of the core and the portion of the second layer is bonded to the second surface of the core.

7. The enclosure of claim 1, wherein the core varies in thickness.

* * * * *